United States Patent  
Ervin et al.

(10) Patent No.: US 8,299,515 B2  
(45) Date of Patent: Oct. 30, 2012

(54) METHOD OF FORMING DEEP TRENCH CAPACITOR

(75) Inventors: Joseph E. Ervin, Wappingers Falls, NY (US); Yanli Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/023,047

(22) Filed: Feb. 8, 2011

(65) Prior Publication Data

US 2012/0199945 A1 Aug. 9, 2012

(51) Int. Cl.
H01L 29/94 (2006.01)
(52) U.S. Cl. ........ 257/301; 257/302; 257/305; 438/242; 438/246
(58) Field of Classification Search .................. 257/301, 257/302, 305; 438/242, 246
See application file for complete search history.

(56) References Cited

U.S. PATENT DOCUMENTS

| | | | |
|---|---|---|---|
| 6,734,484 B2 * | 5/2004 | Wu ............................ 257/301 |
| 6,806,138 B1 | 10/2004 | Cheng et al. |
| 6,951,822 B2 | 10/2005 | Scholz |
| 7,041,553 B2 | 5/2006 | Kangguo et al. |
| 7,193,262 B2 | 3/2007 | Ho et al. |
| 7,232,718 B2 | 6/2007 | Chang et al. |
| 7,521,748 B2 | 4/2009 | Fleming, Jr. et al. |
| 7,560,360 B2 | 7/2009 | Cheng et al. |
| 2008/0248625 A1 | 10/2008 | Cheng et al. |
| 2008/0258268 A1 | 10/2008 | Cheng |
| 2009/0230508 A1 | 9/2009 | Dyer et al. |

OTHER PUBLICATIONS

Mandelman et al., Challenges and Future Directions for the Scaling of Dynamic Random-Access Memory (DRAM), IBM J. Res. & Dev., vol. 46, No. 2/3, Mar./May 2002, pp. 187-212.

* cited by examiner

*Primary Examiner* — Howard Weiss
*Assistant Examiner* — Steven Rao
(74) *Attorney, Agent, or Firm* — David A. Cain; Hoffman Warnick LLC (57) ABSTRACT

Aspects of the invention provide for methods of forming a deep trench capacitor structure. In one embodiment, aspects of the invention include a method of forming a deep trench capacitor structure, including: forming a deep trench within a semiconductor substrate; depositing a first liner within the deep trench; filling a lower portion of the deep trench with a filler material; depositing a second liner within an upper portion of the deep trench; removing the filler material, such that the lower portion of the deep trench includes only the first liner and the upper portion of the deep trench includes the first liner and the second liner; forming a high doped region around the lower portion of the deep trench; and removing the first liner within the lower portion of the deep trench and the second liner within the upper portion of the deep trench.

20 Claims, 11 Drawing Sheets

METHOD OF FORMING DEEP TRENCH CAPACITOR

BACKGROUND OF THE INVENTION

The subject matter disclosed herein relates generally to semiconductor devices. More specifically, the present disclosure relates to deep trench capacitor formation with a dual liner process.

In semiconductor devices, the capacitance value of a deep trench depends on the size of the deep trench area. The deeper the deep trench, the larger the capacitance value. In forming the deep trench, the deep trench implant can affect the electrical properties of the semiconductor device by laterally diffusing into the silicon-on-insulator (SOI) region.

In a first semiconductor technology (e.g., 32 nm technology), in order to protect the SOI region from the deep trench implant, a single spacer may be used. However, the thickness of this spacer prevents the opening of the deep trench in the substrate area from being as large as possible. This affects the capacitance value of the deep trench. In a second semiconductor technology (e.g., 22 nm technology), a highly-doped epitaxial layer may be formed between the buried oxide (BOX) layer and the substrate, so that no spacer is needed to protect the SOI region. However, it is difficult to control the out diffusion of the epitaxial layer and the wafer processing may be expensive. Further, the wafer substrate material is changed from a lightly-doped substrate to a substrate with a highly-doped epitaxial layer, which affects the type of devices this process can be used on.

BRIEF DESCRIPTION OF THE INVENTION

Aspects of the invention provide for methods of forming a deep trench capacitor structure. In one embodiment, aspects of the invention include a method of forming a deep trench capacitor structure, comprising: forming a deep trench within a semiconductor substrate; depositing a first liner within the deep trench; filling a lower portion of the deep trench with a filler material; depositing a second liner within an upper portion of the deep trench; removing the filler material, such that the lower portion of the deep trench includes only the first liner and the upper portion of the deep trench includes the first liner and the second liner; forming a high doped region around the lower portion of the deep trench; and removing the first liner within the lower portion of the deep trench and the second liner within the upper portion of the deep trench.

A first aspect of the invention provides a method of forming a deep trench capacitor structure, comprising: forming a deep trench within a semiconductor substrate; depositing a first liner within the deep trench; filling a lower portion of the deep trench with a filler material; depositing a second liner within an upper portion of the deep trench; removing the filler material, such that the lower portion of the deep trench includes only the first liner and the upper portion of the deep trench includes the first liner and the second liner; forming a high doped region around the lower portion of the deep trench; and removing the first liner within the lower portion of the deep trench and the second liner within the upper portion of the deep trench.

A second aspect of the invention provides a method of forming a deep trench capacitor structure, comprising: forming a deep trench within a semiconductor substrate; depositing a first nitride liner within the deep trench; filling a lower portion of the deep trench with an oxide material; depositing a second nitride liner within an upper portion of the deep trench; removing the oxide material, such that the lower portion of the deep trench includes only the first nitride liner and the upper portion of the deep trench includes the first nitride liner and the second nitride liner; forming a high doped region around the lower portion of the deep trench; and removing the first nitride liner within the lower portion of the deep trench and the second nitride liner within the upper portion of the deep trench.

A third aspect of the invention provides a deep trench capacitor structure, comprising: a buried oxide (BOX) layer positioned atop a semiconductor substrate; a silicon-on-insulator layer positioned atop the BOX layer; and a deep trench within the SOI layer, the BOX layer, and the semiconductor substrate, the deep trench including: an upper portion including the SOI layer and a least a portion of the BOX layer; and a lower portion including the semiconductor substrate and a remaining portion of the BOX layer, wherein the upper portion includes a first liner and a second liner and the lower portion includes only the first liner.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As used herein, the term "depositing" may include any now known or later developed techniques appropriate for a material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Figure 1:
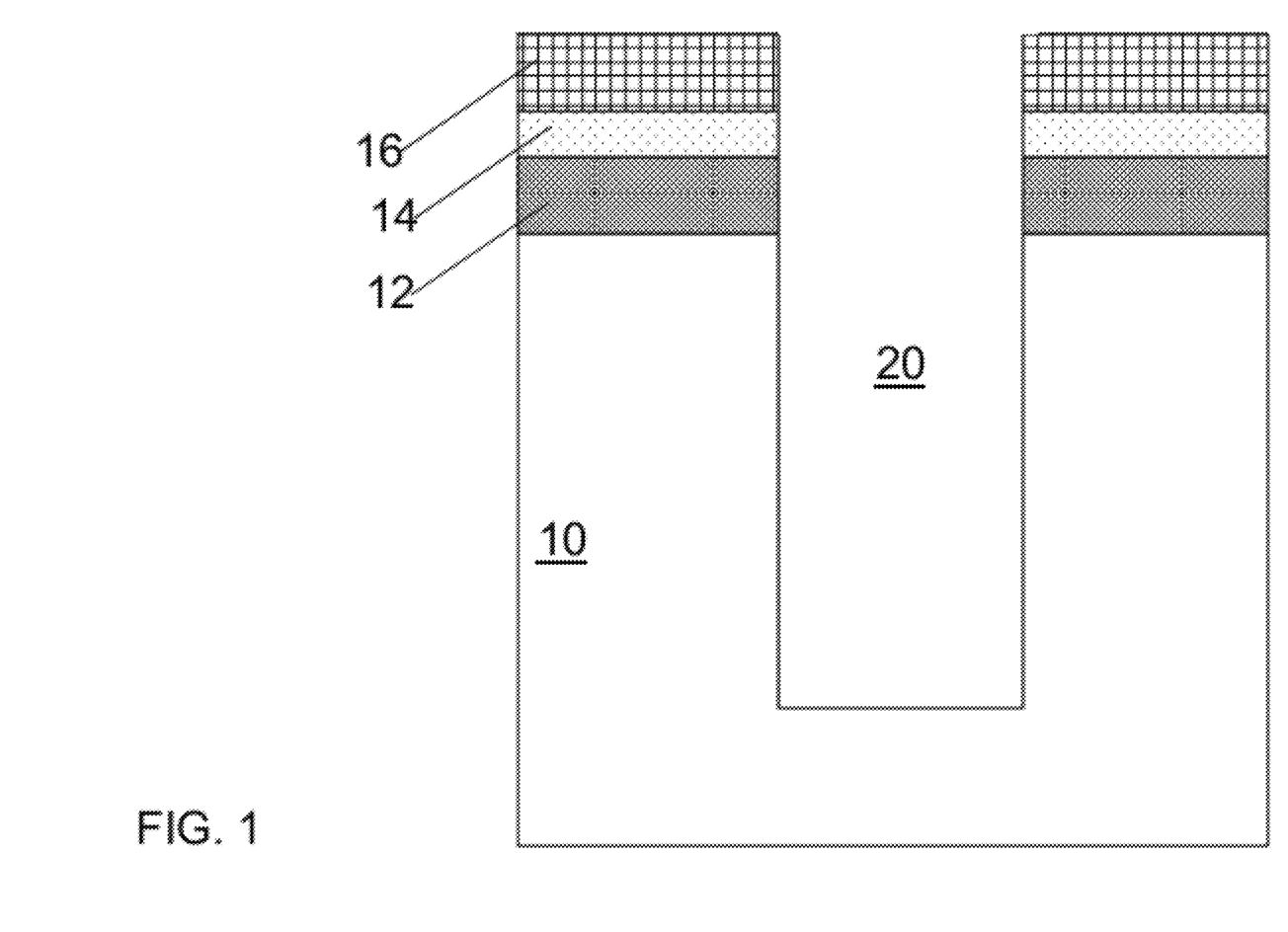
FIG. 1 shows a method of forming a deep trench capacitor structure according to embodiments of the invention.

Turning to FIGS. 1-11, a method of forming a deep trench capacitor structure according to embodiments of the invention is shown. As seen in FIG. 1, a substrate 10 is provided. Substrate 10 can comprise any commonly used substrate material including but not limited to silicon, germanium, silicon germanium, gallium arsenide, and silicon carbide. Buried oxide (BOX) layer 12 is positioned atop substrate 10 and silicon-on-insulator (SOI) layer 14 is positioned atop BOX layer 12. A mask layer 16 may be provided atop SOI layer 14. A deep trench 20 is etched through mask layer 16, SOI layer 14, BOX layer 12, and within substrate 10. The depth of deep trench 20 may be any depth within substrate 10 in order to produce a specified capacitance value.

Figure 2:
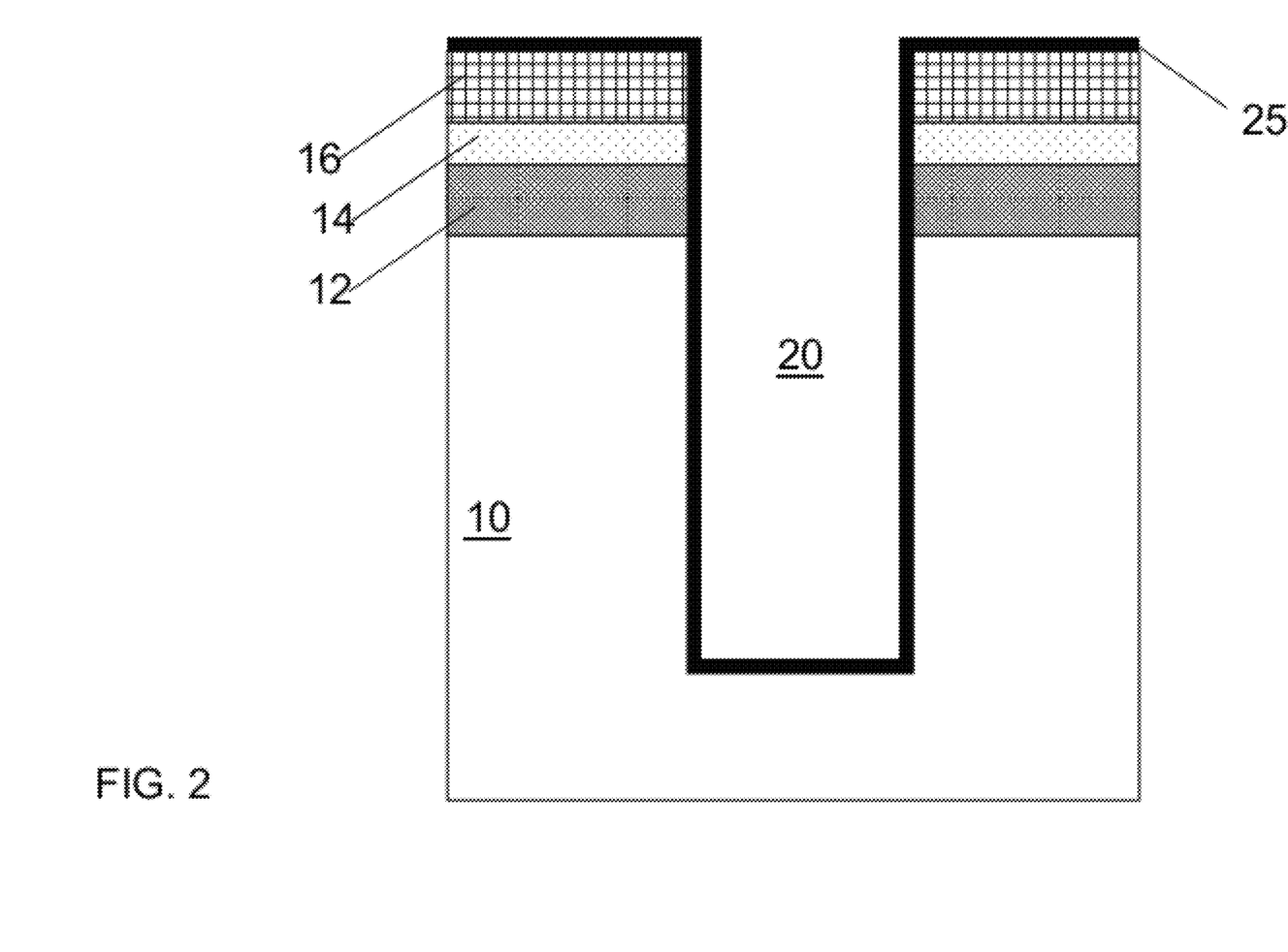
FIG. 2 shows a method of forming a deep trench capacitor structure according to embodiments of the invention.

Turning now to FIG. 2, a first liner 25 is deposited within deep trench 20. First liner 25 is positioned along the sidewalls and the bottom of deep trench 20. Further, first liner 25 may be positioned on top of mask layer 16. First liner 25 may include any now known or later developed liner material, such as, but not limited to, nitride. Since first liner 25 is formed after deep trench 20 is etched into substrate 10, the thickness of first liner 25 will not affect the depth of deep trench 20.

Figure 3:
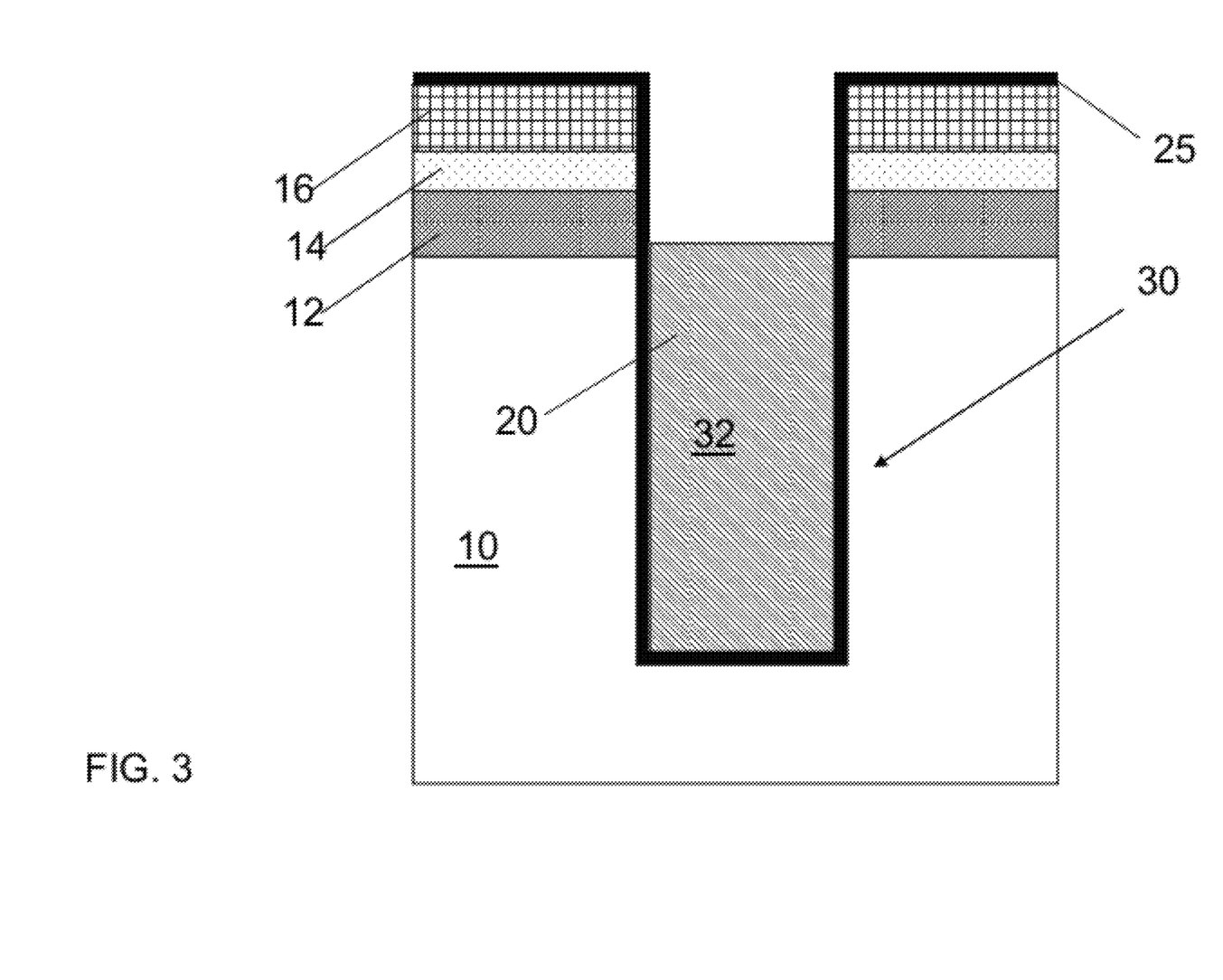
FIG. 3 shows a method of forming a deep trench capacitor structure according to embodiments of the invention.

Turning now to FIG. 3, a lower portion 30 of deep trench 20 is filled with a filler material 32. Lower portion 30 of deep trench 20 includes any portion that includes the portion of deep trench 20 within substrate 10 and overlaps at least a portion of BOX layer 12. In this way, filler material 32 may include any now known or later developed filler material that includes an etch rate that is faster than the etch rate of first liner 25. For example, if first liner 25 includes nitride, filler material 32 may include an oxide.

Figure 4:
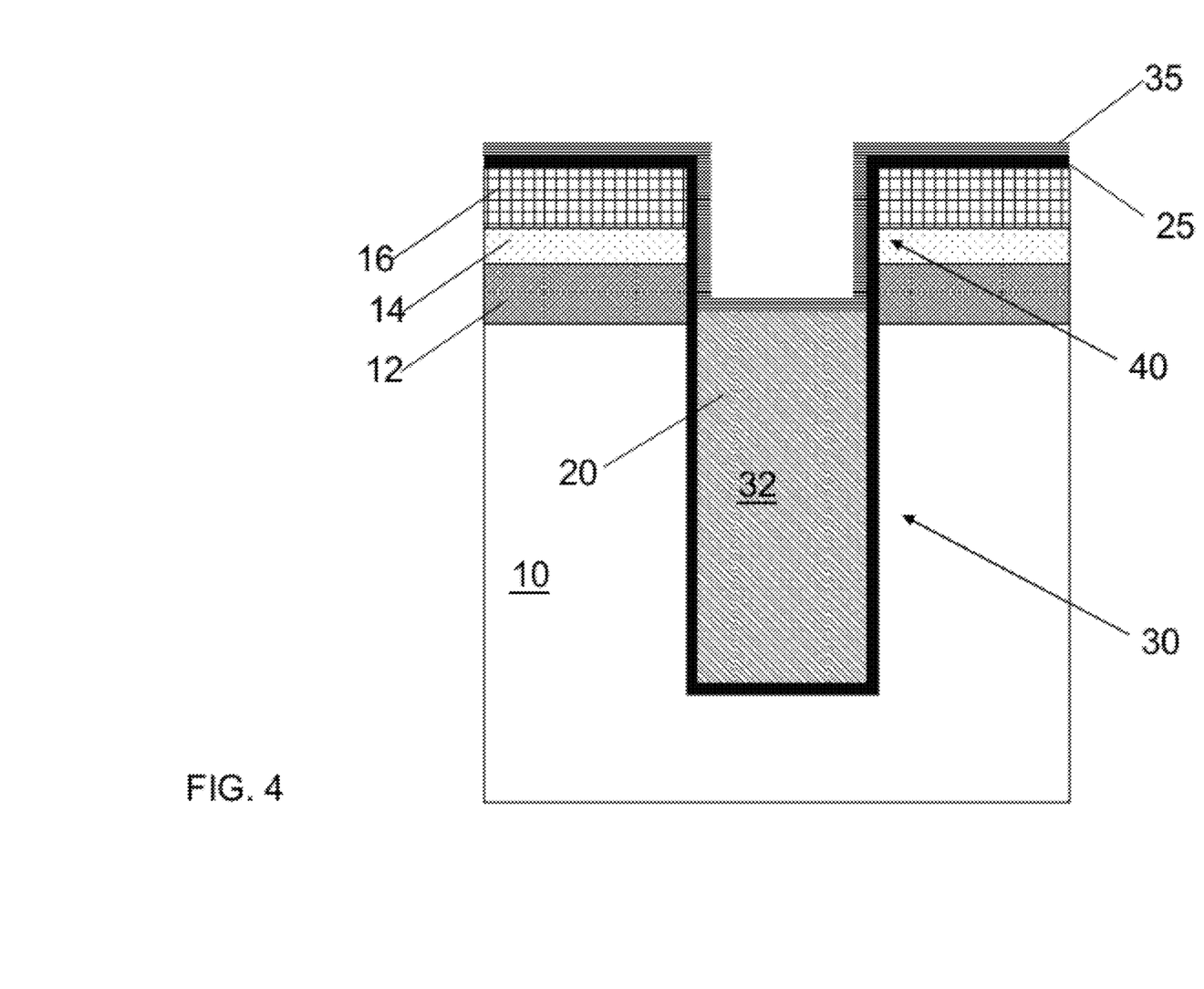
FIG. 4 shows a method of forming a deep trench capacitor structure according to embodiments of the invention.

Turning now to FIG. 4, a second liner 35 is deposited within an upper portion 40 of deep trench 20. Second liner 35 is positioned on first liner 25, along the sidewalls of upper portion 40 of deep trench 20 and on top of filler material 32. Second liner 35 may also be on top of first liner 25 above mask layer 16. Upper portion 40 of deep trench 20 must include at least SOI layer 14, such that SOI layer 14 is protected by first liner 25 and second liner 35. That is, upper portion 40 of deep trench 20 includes a liner thickness (including first liner 25 and second liner 35), that is greater than the liner thickness (including only first liner 25), in lower portion 30 of deep trench 20. Second liner 35 may include any now known or later developed liner material, such as, but not limited to, nitride.

Figure 5:
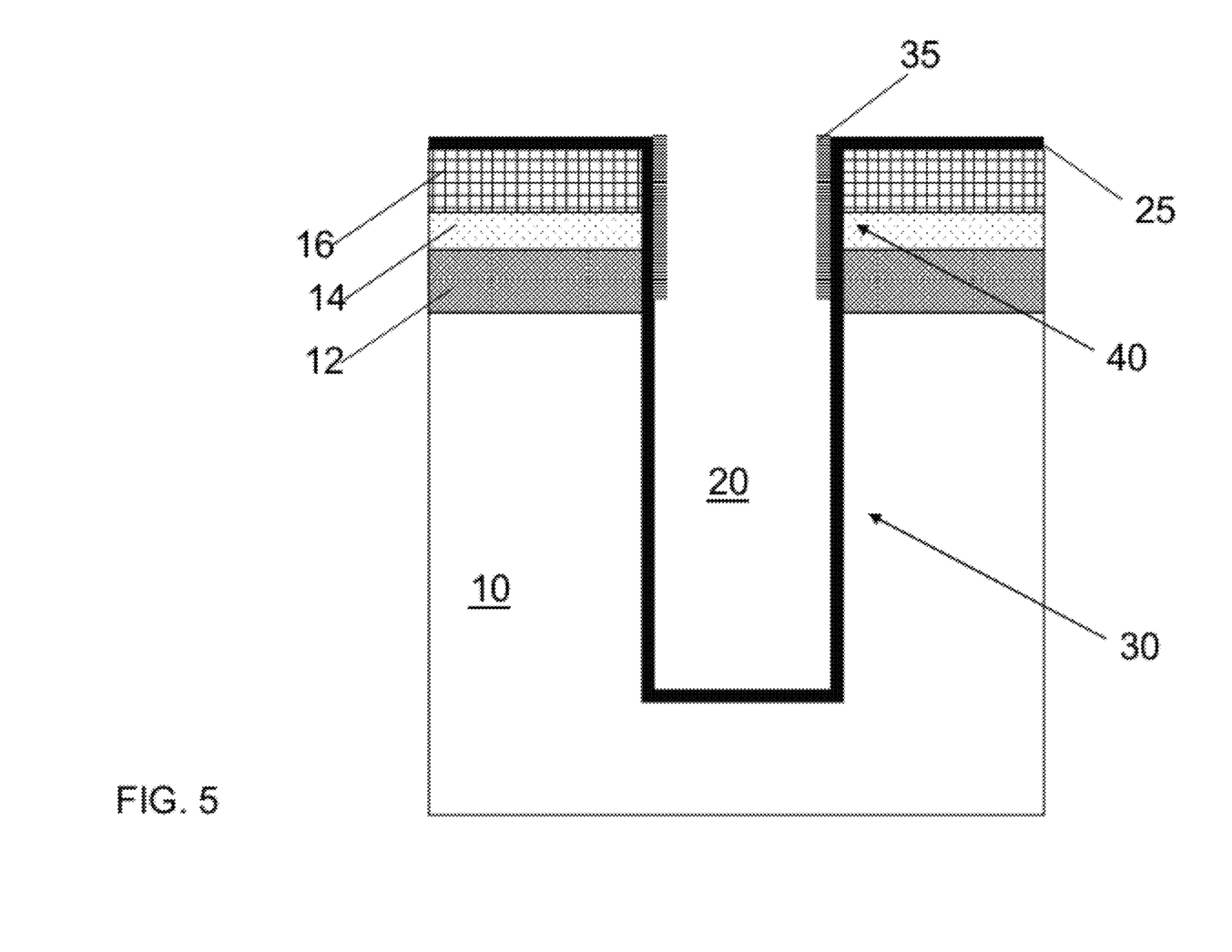
FIG. 5 shows a method of forming a deep trench capacitor structure according to embodiments of the invention.

Turning now to FIG. 5, the portion of second liner 35 on top of first liner 25 above mask layer 16 may be removed and the portion of second liner 35 on top of filler material 32 may be removed. Further, filler material 32 may be removed, for example, by etching, from within lower portion 30 of deep trench 20. As mentioned above, lower portion 30 of deep trench includes only first liner 25 and upper portion 40 of deep trench 20 includes both first liner 25 and second liner 35. Therefore, upper portion 40 of deep trench 20 includes a greater liner thickness than lower portion 30 of deep trench 20.

Figure 6:
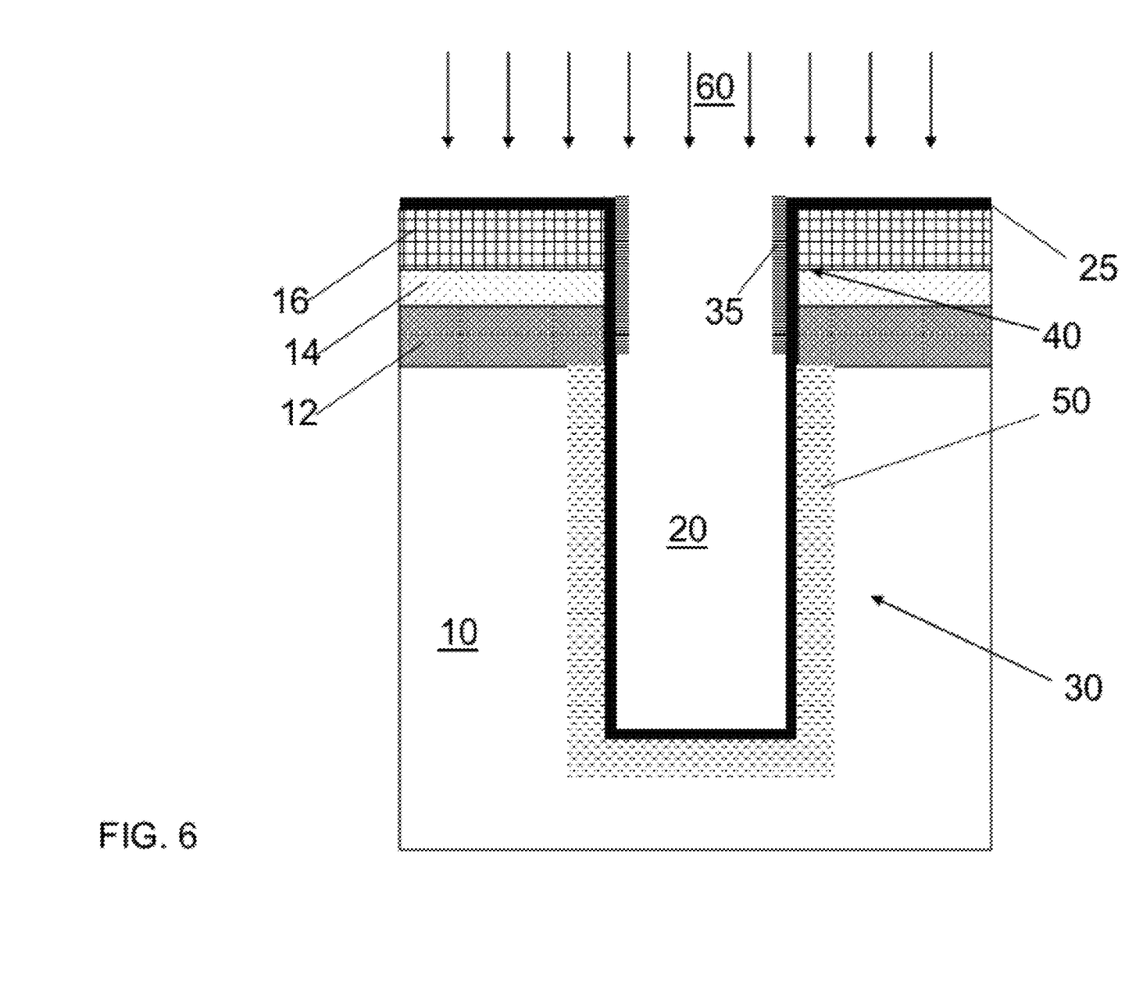
FIG. 6 shows a method of forming a deep trench capacitor structure according to embodiments of the invention.

Turning now to FIG. 6, a high doped region 50 is formed around lower portion 30 of deep trench 20. High doped region 50 may be formed by an ion implant 60. First liner 25 and second liner 35 protects SOI layer 14 from the lateral scattering of ion implant 60 diffusing into SOI layer 14.

Figure 7:
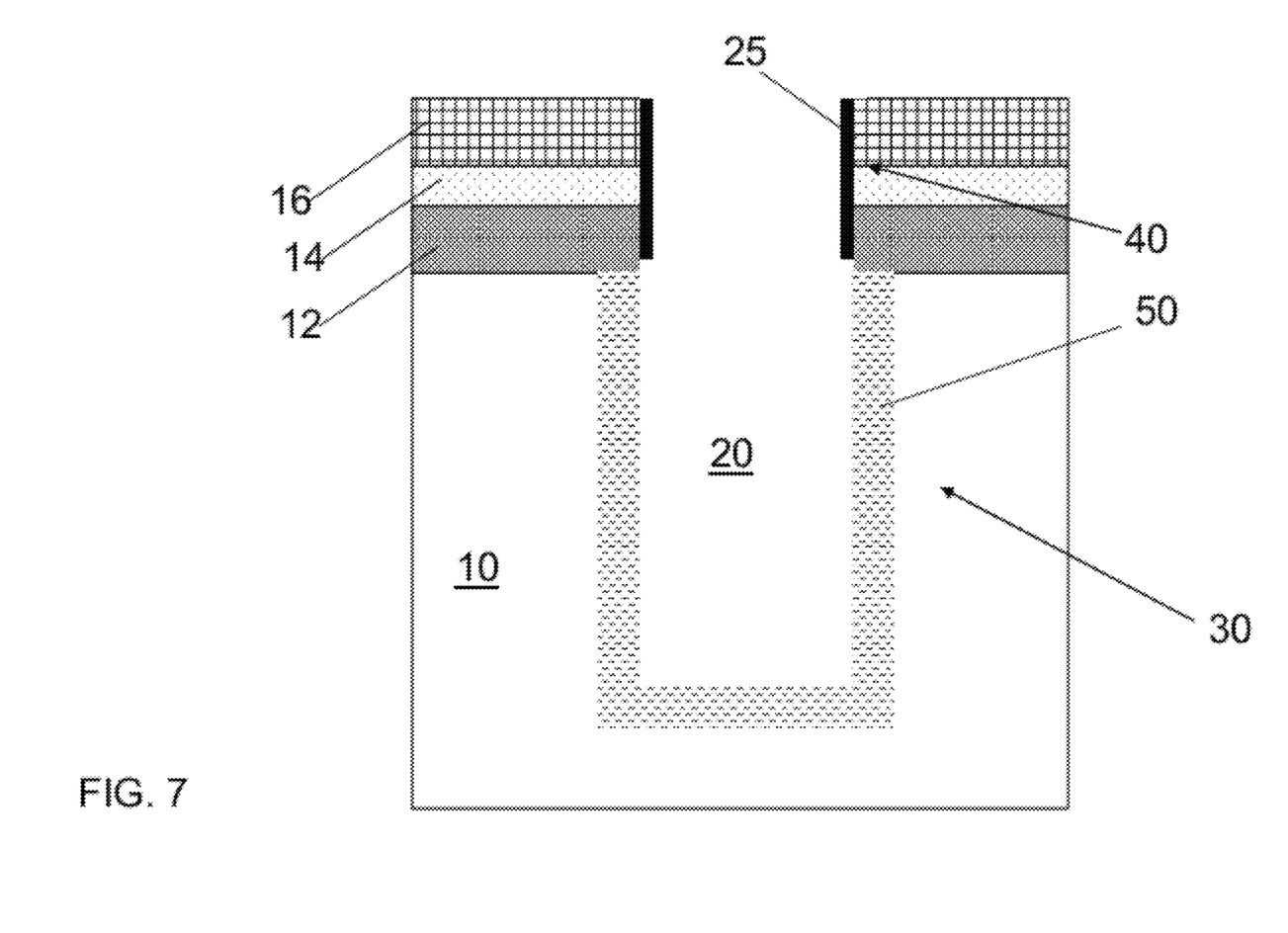
FIG. 7 shows a method of forming a deep trench capacitor structure according to embodiments of the invention.

Turning now to FIG. 7, first liner 25 is removed, by, for example, over etching, from within lower portion 30 of deep trench 20. Second liner 35 is also removed, by, for example, over etching, from within upper portion 40 of deep trench 20. In this way, only upper portion 40 of deep trench 20 includes a liner (first liner 25).

Figure 8:
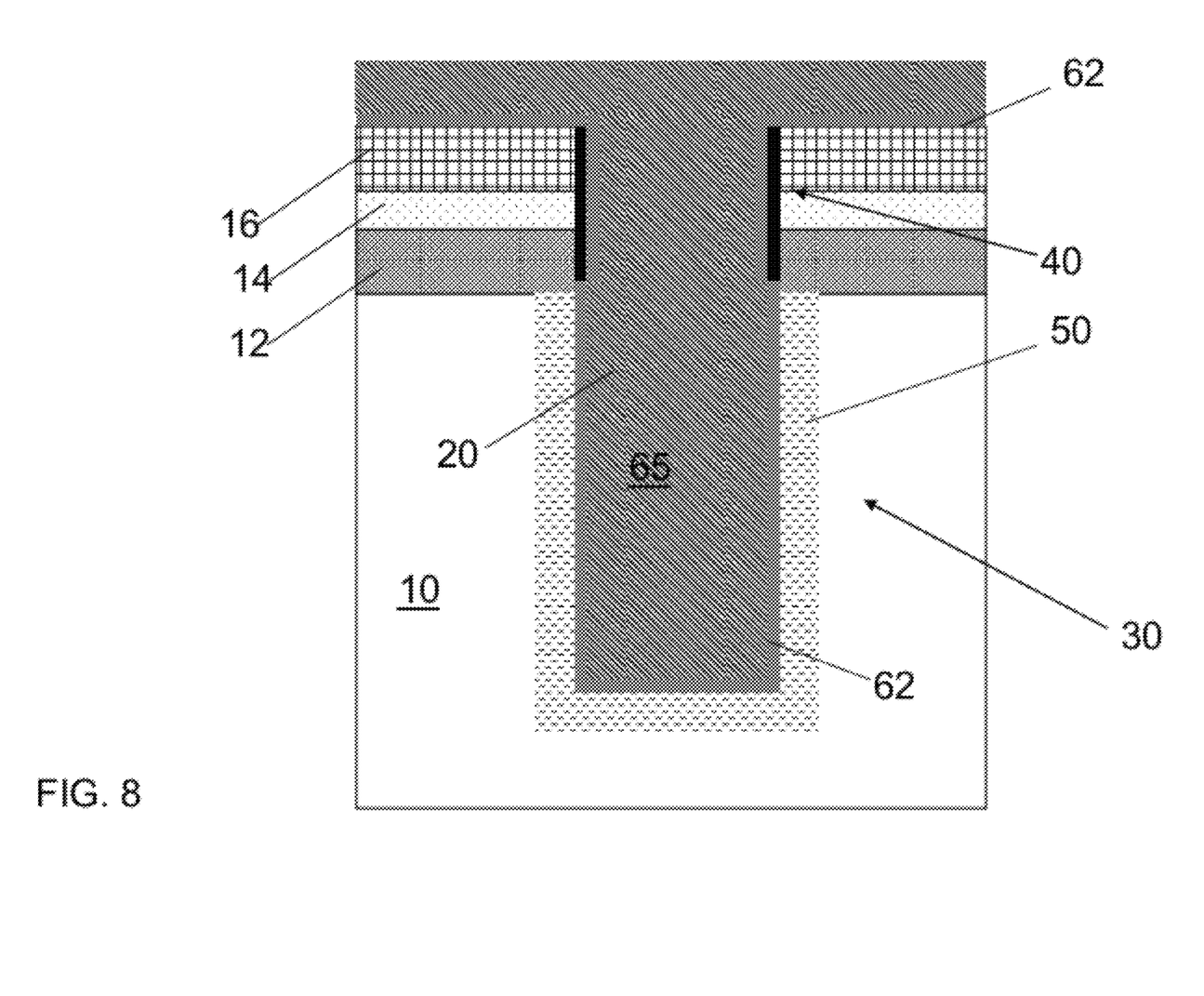
FIG. 8 shows a method of forming a deep trench capacitor structure according to embodiments of the invention.
Figure 9:
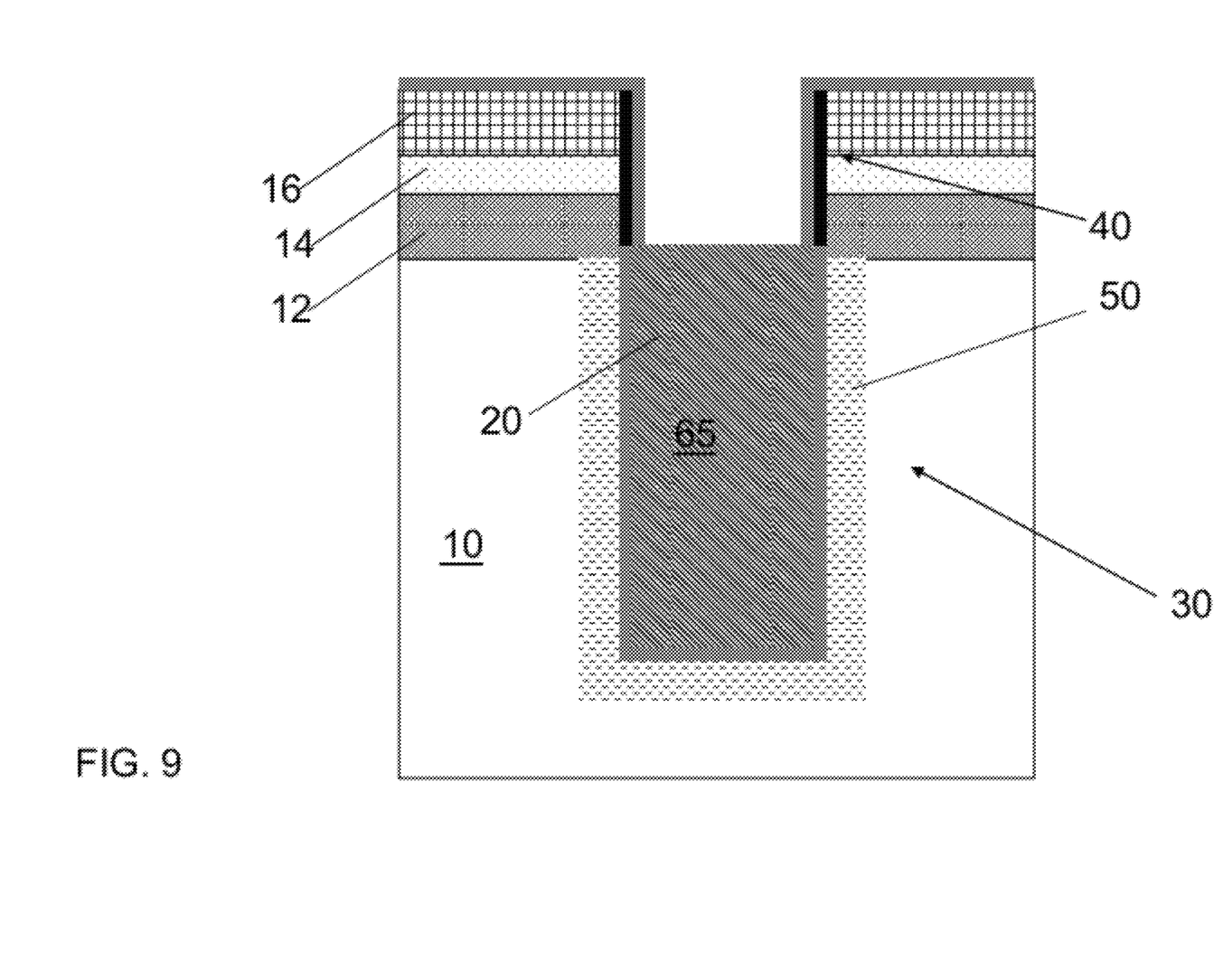
FIG. 9 shows a method of forming a deep trench capacitor structure according to embodiments of the invention.

Turning now to FIGS. 8-11, the remaining portions of conventional deep trench capacitor structure process flow may be performed. For example, as seen in FIG. 8, a dielectric layer 62 is deposited within deep trench 20. Further, a first polysilicon material 65 is deposited over dielectric layer 62, within deep trench 20. As seen in FIG. 9, polysilicon material 65 is recessed and removed from upper portion 40 of deep trench 20.

Figure 10:
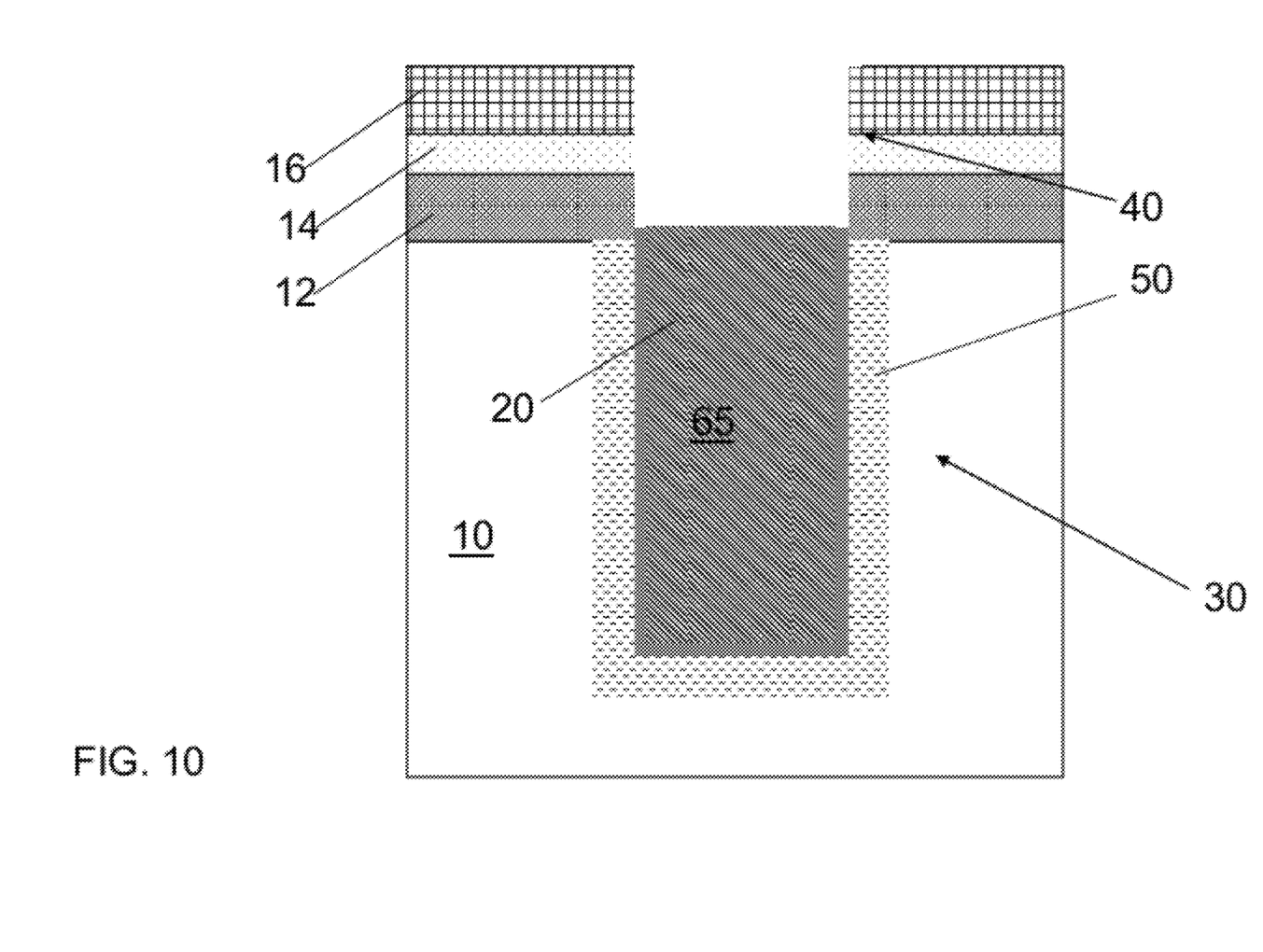
FIG. 10 shows a method of forming a deep trench capacitor structure according to embodiments of the invention.
Figure 11:
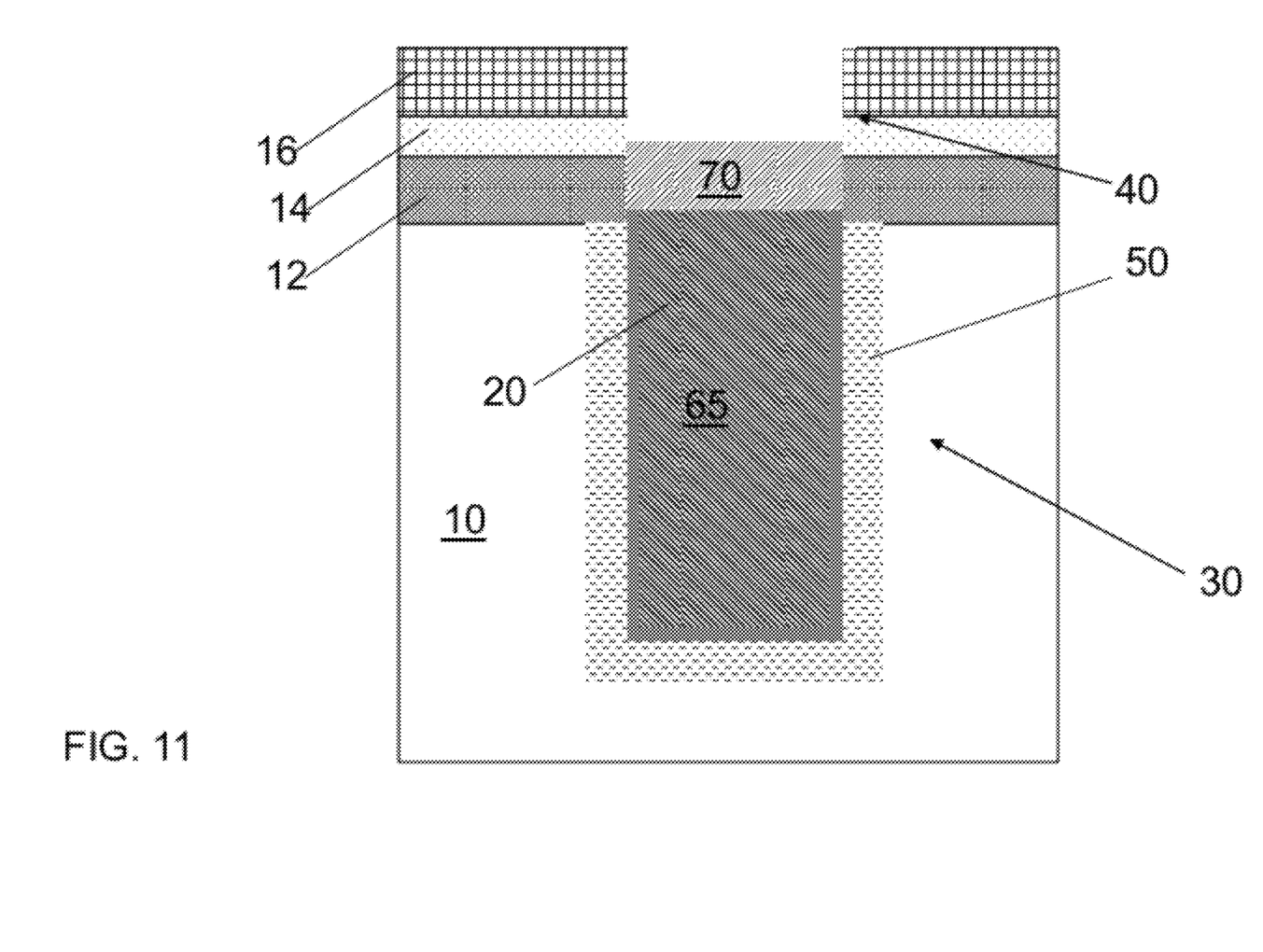
FIG. 11 shows a method of forming a deep trench capacitor structure according to embodiments of the invention.

First liner 25 and dielectric layer 62 are also removed from upper portion 40 of deep trench 20. A second polysilicon material 70 may be deposited within deep trench 20. As seen in FIG. 11, second polysilicon material 70 is within upper portion 40 of deep trench 20 and on top of first polysilicon material 65. A portion of second polysilicon material 70 overlaps a portion of SOI layer 14.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a deep trench capacitor structure, comprising:
    forming a deep trench within a semiconductor substrate;
    depositing a first liner within the deep trench;
    filling a lower portion of the deep trench with a filler material;
    depositing a second liner within an upper portion of the deep trench, such that the second liner is deposited over a top surface of the filler material and over the first liner along a pair of sidewalls of the deep trench within the upper portion of the deep trench;
    removing the filler material, such that the lower portion of the deep trench includes only the first liner and the upper portion of the deep trench includes the first liner and the second liner;
    forming a high doped region around the lower portion of the deep trench; and
    removing the first liner within the lower portion of the deep trench and the second liner within the upper portion of the deep trench.

2. The method according to claim 1, wherein the lower portion of the deep trench overlaps at least a portion of a buried oxide (BOX) layer.

3. The method according to claim 1, wherein the second liner is deposited on top of the filler material.

4. The method according to claim 3, further comprising removing a portion of the second liner on top of the filler material.

5. The method according to claim 1, further comprising depositing a dielectric layer within the deep trench.

6. The method according to claim 5, further comprising depositing a first polysilicon material within the deep trench.

7. The method according to claim 6, further comprising removing the first polysilicon material from within the upper portion of the deep trench.

8. The method according to claim 7, further comprising removing the first liner from the upper portion of the deep trench.

9. The method according to claim 8, further comprising depositing a second polysilicon material within the deep trench, such that a portion of the second polysilicon material overlaps a portion of a silicon-on-insulator (SOI) layer.

10. The method according to claim 1, wherein the first and second liner include nitride.

11. The method according to claim 1, wherein the filler material includes oxide.

12. A method of forming a deep trench capacitor structure, comprising:
    forming a deep trench within a semiconductor substrate;
    depositing a first nitride liner within the deep trench;
    filling a lower portion of the deep trench with an oxide material, wherein the lower portion of the deep trench overlaps at least a portion of a buried oxide (BOX) layer;
    depositing a second nitride liner within an upper portion of the deep trench, such that the second nitride liner is deposited over a top surface of the oxide material and over the first nitride liner along a pair of sidewalls of the deep trench within the upper portion of the deep trench;
    removing the oxide material, such that the lower portion of the deep trench includes only the first nitride liner and the upper portion of the deep trench includes the first nitride liner and the second nitride liner;
    forming a high doped region around the lower portion of the deep trench; and
    removing the first nitride liner within the lower portion of the deep trench and the second nitride liner within the upper portion of the deep trench.

13. The method according to claim 12, wherein the second nitride liner is deposited on top of the oxide material.

14. The method according to claim 13, further comprising removing a portion of the second nitride liner on top of the oxide material.

15. The method according to claim 12, further comprising depositing a dielectric layer within the deep trench.

16. The method according to claim 15, further comprising depositing a first polysilicon material within the deep trench.

17. The method according to claim 16, further comprising removing the first polysilicon material from within the upper portion of the deep trench.

18. The method according to claim 17, further comprising removing the first nitride liner from the upper portion of the deep trench.

19. The method according to claim 18, further comprising depositing a second polysilicon material within the deep trench, such that a portion of the second polysilicon material overlaps a portion of a silicon-on-insulator (SOI) layer.

20. A deep trench capacitor structure, comprising:
    a buried oxide (BOX) layer positioned atop a semiconductor substrate;
    a silicon-on-insulator (SOI) layer positioned atop the BOX layer; and
    a deep trench within the SOI layer, the BOX layer, and the semiconductor substrate, the deep trench including:
        an upper portion including the SOI layer and a least a portion of the BOX layer; and
        a lower portion including the semiconductor substrate and a remaining portion of the BOX layer,
        wherein the upper portion includes a first liner and a second liner along a pair of sidewalls of the upper portion of the deep trench and the lower portion includes only the first liner along a pair of sidewalls of the lower portion of the deep trench.

* * * * *